United States Patent
Toriyama et al.

(10) Patent No.: US 9,792,991 B1
(45) Date of Patent: Oct. 17, 2017

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventors: Shuichi Toriyama, Yokohama (JP); Hideto Horii, Yokohama (JP); Tomoya Kawai, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/442,183

(22) Filed: Feb. 24, 2017

(30) Foreign Application Priority Data

Sep. 21, 2016 (JP) .................. 2016-184250

(51) Int. Cl.
  *G11C 16/04* (2006.01)
  *G11C 16/10* (2006.01)
  *G11C 16/26* (2006.01)
  *G11C 16/34* (2006.01)

(52) U.S. Cl.
  CPC .......... *G11C 16/10* (2013.01); *G11C 16/0483* (2013.01); *G11C 16/26* (2013.01); *G11C 16/3459* (2013.01)

(58) Field of Classification Search
  CPC ...... G11C 16/04; G11C 16/10; G11C 16/0483
  USPC .................................................. 365/185.18
  See application file for complete search history.

(56) References Cited

U.S. PATENT DOCUMENTS

| | | | | |
|---|---|---|---|---|
| 2009/0135656 A1* | 5/2009 | Park | .......... | G11C 7/14 365/185.19 |
| 2011/0128789 A1* | 6/2011 | Hazama | .......... | G11C 16/10 365/185.11 |
| 2012/0262989 A1* | 10/2012 | Hazama | .......... | G11C 16/10 365/185.11 |
| 2013/0070532 A1* | 3/2013 | Nawata | .......... | G11C 16/10 365/185.22 |
| 2013/0279261 A1* | 10/2013 | Hazama | .......... | G11C 16/10 365/185.18 |
| 2014/0063972 A1 | 3/2014 | Maeda | | |

FOREIGN PATENT DOCUMENTS

| | | |
|---|---|---|
| JP | 2007-226897 | 9/2007 |
| JP | 2011-187140 | 9/2011 |
| JP | 2014-44784 | 3/2014 |

* cited by examiner

*Primary Examiner* — Harry W Byrne
(74) *Attorney, Agent, or Firm* — Oblon, McClelland, Maier & Neustadt, L.L.P.

(57) ABSTRACT

In a write operation to memory cells, the control unit is operative to, when a threshold voltage to be provided to a selected memory cell is not less than a reference value, apply a program voltage to a word line corresponding to a selected memory cell, and cause a voltage applied to a first word line corresponding to a first non-selected memory cell positioned between the first end and the selected memory cell to be higher than a voltage applied to a second word line corresponding to a second non-selected memory cell positioned between the second end and the selected memory cell.

16 Claims, 14 Drawing Sheets

[Lower Page Program]

[Upper Page Program]

SEMICONDUCTOR MEMORY DEVICE AND METHOD OF MANUFACTURING THE SAME

CROSS REFERENCE TO RELATED APPLICATIONS

This application is based on and claims the benefit of priority from prior Japanese Patent Application No. 2016-184250, filed on Sep. 21, 2016, the entire contents of which are incorporated herein by reference.

FIELD

Embodiments described hereinbelow relate to a semiconductor memory device and a method of manufacturing the same.

BACKGROUND

In recent years, while miniaturizing of NAND-type flash memories is in progress, interference between elements in a data write operation has become serious. That is, when data is written in a NAND type flash memory, a write pass voltage is applied to the gates of non-selected memory cells. The write pass voltage is a voltage that sets the non-selected memory cells to an ON state, but does not change a threshold voltage thereof. In contrast, a program voltage that is higher than the write pass voltage is applied to the gate of a selected memory cell that is a subject to writing. This changes the threshold voltage of the selected memory cell.

However, due to inter-element interference between adjacent memory cells caused by progress in miniaturization, there is an increasing possibility that the threshold voltage of the adjacent memory cells changes.

DETAILED DESCRIPTION

The semiconductor memory device according to embodiments comprises: a memory cell array in which a plurality of memory cells are connected in series to form a memory unit; word lines connected to control gates of the plurality of memory cells; a bit line connected to a first end of the memory unit; a source line connected to a second end of the memory unit; and a control unit that controls the memory cell array. In a write operation to the memory cells, the control unit is operative to, when a threshold voltage to be provided to a selected memory cell is not less than a reference value, apply a program voltage to a word line corresponding to a selected memory cell, and cause voltage applied to a first word line corresponding to a first non-selected memory cell positioned between the first end and the selected memory cell to be higher than a voltage applied to a second word line corresponding to a second non-selected memory cell positioned between the second end and the selected memory cell.

Embodiments will be explained with reference to the drawings hereinbelow.

First Embodiment

Next, the non-volatile semiconductor memory device according to embodiments will be described in detail with reference to the drawings. These embodiments are merely examples, and is not intended to limit the scope of the present invention.

For example, the non-volatile semiconductor memory devices described hereinbelow have a structure in which a memory string extends in a straight line in a direction crossing the substrate. However, a similar structure is applicable to a structure in which a memory string has a U-shape that folds back to the opposite side in midway. For example, the respective drawings of the semiconductor memory devices used in the following embodiments are schematically illustrated. The thickness, the width, the ratio, and a similar parameter of the layer are not necessarily identical to actual parameters.

The following embodiments relate to a semiconductor memory device in a structure where a plurality of metal-oxide-nitride-oxide-semiconductor (MONOS) type memory cells (transistors) are provided along a direction intersecting with a substrate. The MONOS type memory cell includes: a semiconductor layer that is disposed in the a direction intersecting with the substrate and serves as a channel, and a gate electrode film disposed on the side surface of the semiconductor layer via a charge accumulating layer. The memory cell may be another format, however, for example, a semiconductor-oxide-nitride-oxide-semiconductor type memory cell (SONOS), or a floating-gate type memory cell.

Figure 1:
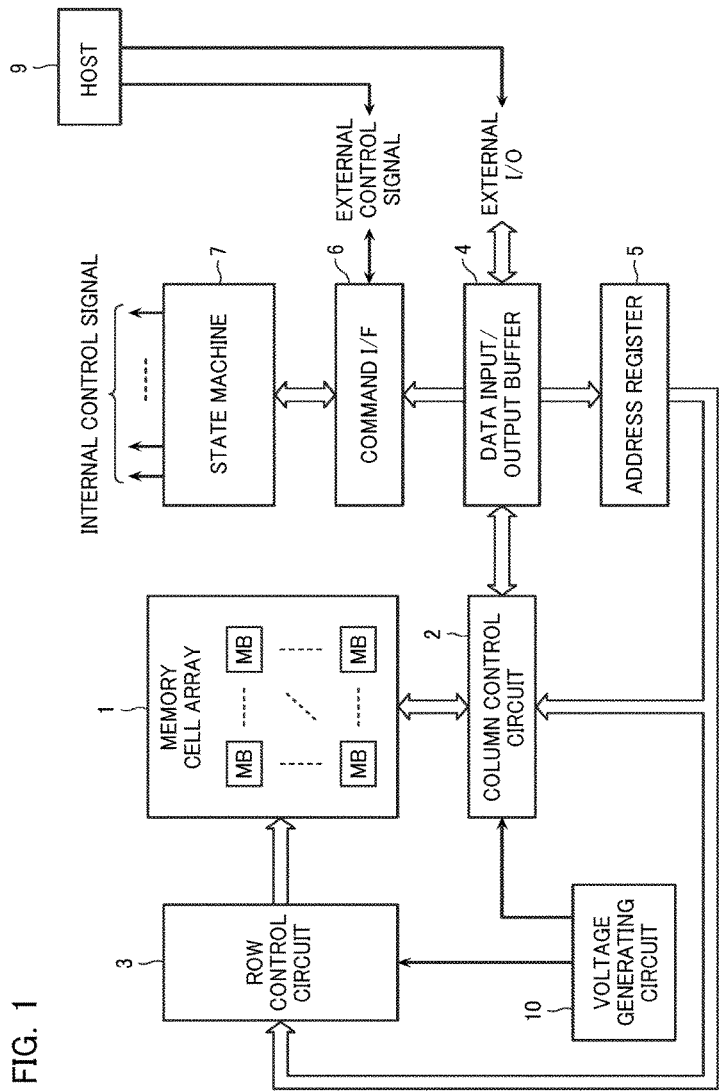
FIG. 1 is a block diagram of the nonvolatile semiconductor memory device according to the first embodiment.

FIG. 1 is a block diagram of a non-volatile semiconductor memory device according to a first embodiment. The non-volatile semiconductor memory device according to the first embodiment stores user data input from an external host 9 in a predetermined address in a memory cell array 1. The non-volatile semiconductor memory device reads user data from a predetermined address in the memory cell array 1 to output to the external host 9.

The non-volatile semiconductor memory device includes the memory cell array 1 that stores data. The memory cell array 1 includes a plurality of memory blocks MB. These memory blocks MB, as described later in FIG. 2, include a plurality of memory cells, and a bit line BL and a word line WL that are connected to these memory cells.

The non-volatile semiconductor memory device includes a column control circuit 2 disposed around the periphery of the memory cell array 1. The column control circuit transfers voltage generated in a voltage generation circuit 10 to a desired bit line BL corresponding to input user data. The column control circuit 2 includes a sense amplifier (not shown) to sense voltage or current of a predetermined bit line BL when user data is read.

The non-volatile semiconductor memory device includes a row control circuit 3 disposed provided around the periphery of the memory cell array 1. The row control circuit 3 transfers voltage generated in the voltage generation circuit 10 to a desired word line WL or similar line corresponding to input address data.

The non-volatile semiconductor memory device includes an address register 5 that supplies address data to the column control circuit 2 and the row control circuit 3. The address register 5 holds address data input from a data input/output buffer 4.

The non-volatile semiconductor memory device includes the voltage generation circuit 10 that supplies voltage to the memory cell array 1 via the column control circuit 2 and the row control circuit 3. The voltage generation circuit 10 generates and outputs predetermined magnitude of voltage at a predetermined timing corresponding to an internal control signal input from a state machine 7.

The non-volatile semiconductor memory device includes the state machine 7 that inputs the internal control signal to the voltage generation circuit 10 or similar circuit. The state machine 7 accepts command data from the host 9 via a command interface 6 to perform input and output management or similar operation of data, such as reading, writing, and erasing.

The non-volatile semiconductor memory device includes the data input/output buffer 4 connected to the external host 9 via an I/O line. The data input/output buffer 4 receives writing data from the external host 9 to transfer the data to the column control circuit 2. The data input/output buffer 4 receives command data from the external host 9 to transfer the data to the command interface 6. The data input/output buffer 4 receives address data from the external host 9 to transfer the data to the address register 5. Further, the data input/output buffer 4 receives reading data from the column control circuit 2 to transfer the data to the external host 9.

The non-volatile semiconductor memory device includes the command interface 6 that accepts an external control signal from the external host 9. The command interface 6 determines whether data input to the data input/output buffer 4 is any of writing data, command data, and address data, depending on the external control signal input from the external host 9, thereby controlling the data input/output buffer 4. The command interface 6 transfers the command data received from the data input/output buffer 4 to the state machine 7.

The column control circuit 2, the row control circuit 3, the state machine 7, the voltage generation circuit 10, or similar circuit configure a control circuit that controls the memory cell array 1.

Figure 2:
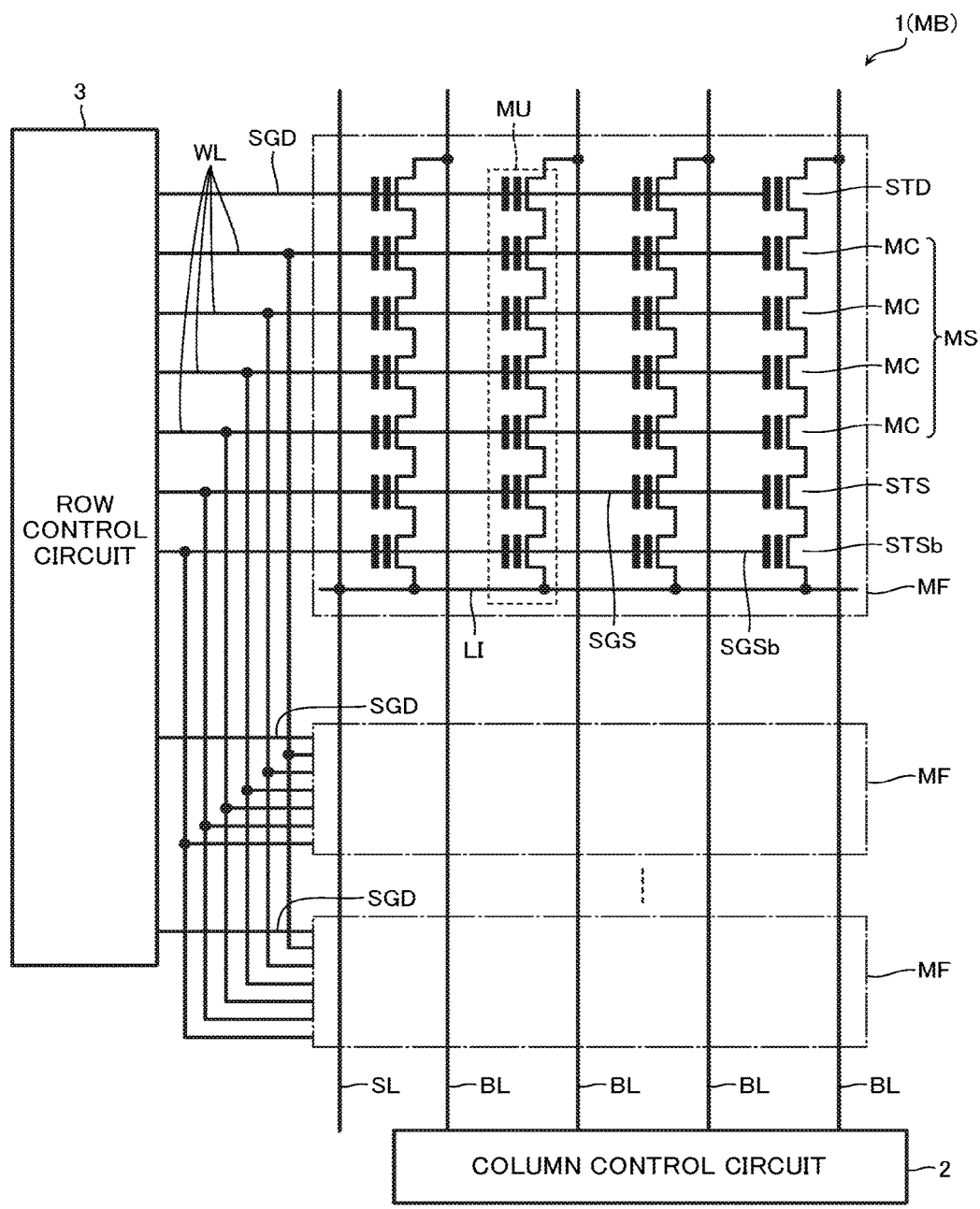
FIG. 2 is an equivalent circuit diagram that illustrates a structure of the memory blocks MB included in the memory cell array 1.

The following describes a part of a circuit configuration of the memory cell array 1 according to the embodiment with reference to FIG. 2. FIG. 2 is an equivalent circuit diagram illustrating a configuration of the memory block MB that configures the memory cell array 1.

The memory block MB includes a plurality of memory cells MC. The memory cells MC each stores data one or plural bits of data that constitutes above-described user data.

At the memory block MB shown in FIG. 2, the row control circuit 3 selects a predetermined drain-side select gate line SGD and a predetermined word line WL to select the predetermined numbers of memory cells MC. The column control circuit 2 reads data from these memory cells MC or write data to these memory cells MC.

The memory blocks MB each include a plurality of memory fingers MF. The plurality of bit lines BL and a source line SL are commonly connected to these plurality of memory fingers MF. The respective memory fingers MF are connected to the column control circuit 2 via the bit line BL, and a source line driver (not shown) via the source line SL.

The memory finger MF includes a plurality of memory units MU. The memory unit MU has one end connected to the bit line BL and the other end connected to the source line SL via a source contact LI. The memory units MU included in one memory finger MF are all connected to different bit lines BL.

The memory unit MU includes the plurality of memory cells MC connected in series. The memory cell MC, as described below, includes a semiconductor layer, a charge accumulating layer, and a control gate electrode. The memory cell MC accumulates charges in the charge accumulating layer corresponding to voltage applied to the control gate electrode to change a control gate voltage (a threshold voltage) that changes the channel to a conductive state. Hereinafter, the plurality of memory cells MC connected in series are referred to as "a memory string MS". The row control circuit 3 transfers voltage to a predetermined word line WL to transfer this voltage to the control gate of a predetermined memory cell MC in the memory string MS.

The common word lines WL are connected to the respective control gates of the plurality of memory cells MC that configure the different memory strings MS. These plurality of memory cells MC are connected to the row control circuit 3 via the word lines WL. In an example shown in FIG. 2, the word lines WL are independently disposed for the respective memory cells MC included in the memory unit MU. The word lines WL are commonly disposed for all memory units MU included in one memory block MB.

The memory unit MU includes a drain-side select gate transistor STD connected between the memory string MS and the bit line BL. The drain-side select gate transistor STD has a control gate connected to the drain-side select gate line SGD. The drain-side select gate line SGD is connected to the row control circuit 3 to connect selectively the memory string MS to the bit line BL corresponding to an input signal. In the example shown in FIG. 2, the drain-side select gate lines SGD are independently disposed for respective the memory fingers MF. The drain-side select gate line SGD is commonly connected to the control gates of all drain-side select gate transistors STD in the memory finger MF. The row control circuit 3 selects a predetermined drain-side select gate line SGD to connect selectively all the memory strings MS in the predetermined memory finger MF to the bit lines BL.

The memory unit MU includes a source-side select gate transistor STS and a lowermost-layer source-side select gate transistor STSb that are connected between the memory string MS and the source contact LI. The source-side select gate transistor STS has a control gate connected to a source-side select gate line SGS. The lowermost-layer source-side select gate transistor STSb has a control gate connected to a lowermost-layer source-side select gate line SGSb. In the example shown in FIG. 2, the source-side select gate line SGS is commonly connected to all the source-side select gate transistors STS in the memory block MB. Similarly, the lowermost-layer source-side select gate line SGSb is commonly connected to all the lowermost-layer source-side select gate transistors STSb in the memory block MB. The row control circuit 3 connects all the memory strings MS in the memory block MB to the source line SL corresponding to the input signal.

Figure 3:
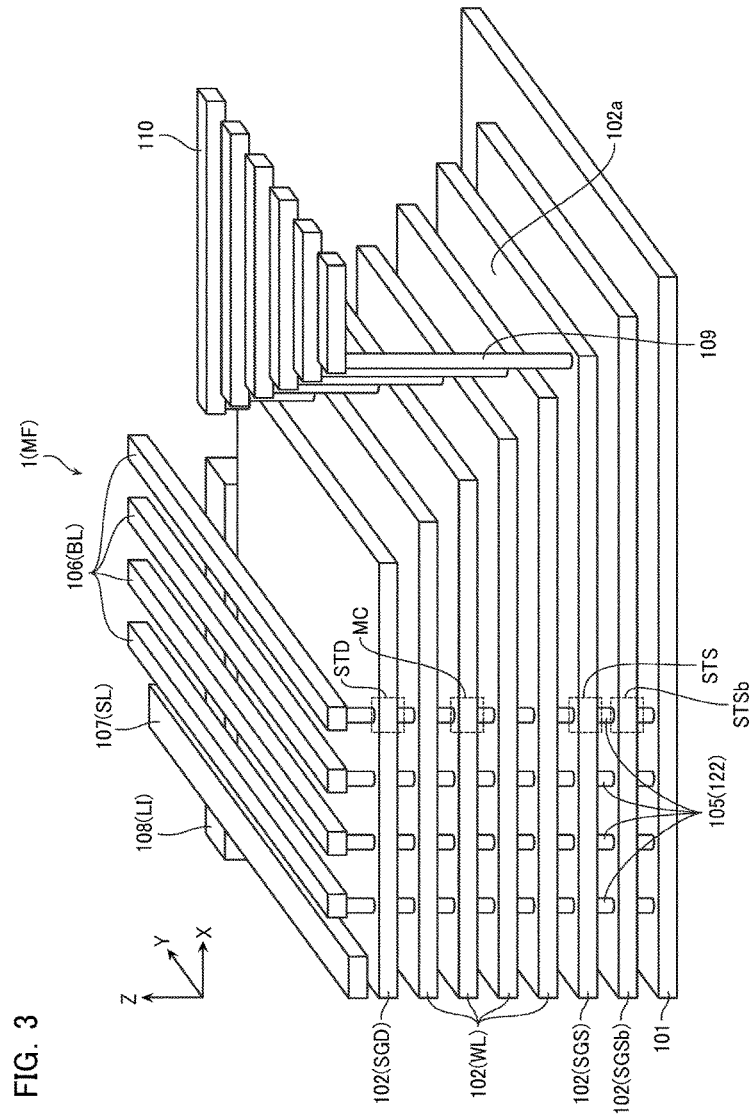
FIG. 3 is a schematic perspective diagram that illustrates a structure of the memory finger MF.

The following describes a schematic configuration of the memory cell array 1 with reference to FIG. 3. FIG. 3 is a schematic perspective view illustrating a part of a configuration of the memory finger MF. FIG. 3 omits a part of the configuration. The configuration shown in FIG. 3 is merely an example. The detailed configuration or a similar configuration can be changed as necessary.

The memory finger MF includes a substrate 101 and the plurality of conductive layers 102 laminated on the substrate 101 in the Z direction. The conductive layers 102 are formed to have a plate shape that surrounds the side surface of a memory shaft 105. The conductive layers 102 and the memory shaft 105 have intersecting portions that function as the lowermost-layer source-side select gate transistor STSb, the source-side select gate transistor STS, the memory cell MC, or the drain-side select gate transistor STD. The conductive layer 102 is composed of, for example, a conductive layer such as tungsten (W) or polysilicon. The respective conductive layers 102 function as the word line WL, a control gate electrode of the memory cell MC, the source-side select gate line SGS, a control gate electrode of the source-side select gate transistor STS, the drain-side select gate line SGD, a control gate electrode of the drain-side select gate transistor STD, the lowermost-layer source-side select gate line SGSb, and a control gate electrode of the lowermost-layer source-side select gate transistor STSb.

The plurality of conductive layers 102 are disposed in a staircase pattern at an end portion in an X direction. That is, the conductive layer 102 includes a contact portion 102a that is not opposed to an inferior surface of a conductive layer 102 positioned above the conductive layer 102. The conductive layer 102 is connected to a via contact wiring 109 (hereinafter simply referred to as "a contact 109") at this contact portion 102a. The via contact wiring 109 has an upper end where a wiring 110 is disposed. The via contact wiring 109 and the wiring 110 are constituted of conductive layers such as tungsten.

The memory finger MF includes a conductive layer 108. The conductive layer 108 has a plate shape that is opposed to side surfaces in a Y direction of the plurality of conductive layers 102 and extends in the X direction and the Z direction. The conductive layer 108 has a lower end in contact with the substrate 101. The conductive layer 108 is made of, for example, metallic material such as tungsten (W). The conductive layer 108 functions as the source contact LI.

The memory finger MF includes a plurality of conductive layers 106 and a conductive layer 107. The plurality of conductive layers 106 and the conductive layer 107 are disposed above the plurality of conductive layers 102 and memory shafts 105. The plurality of conductive layers 106 are disposed in the X direction. The plurality of conductive layers 106 and the conductive layer 107 extend in the Y direction. The memory shafts 105 are each connected to the lower surfaces of the conductive layers 106. The conductive layer 106 is, for example, constituted of a conductive layer such as tungsten (W) and functions as the bit line BL. The conductive layer 108 is connected to the lower surface of the conductive layer 107. The conductive layer 107 is, for example, constituted of the conductive layer such as tungsten (W) and functions as the source line SL.

Figure 4:
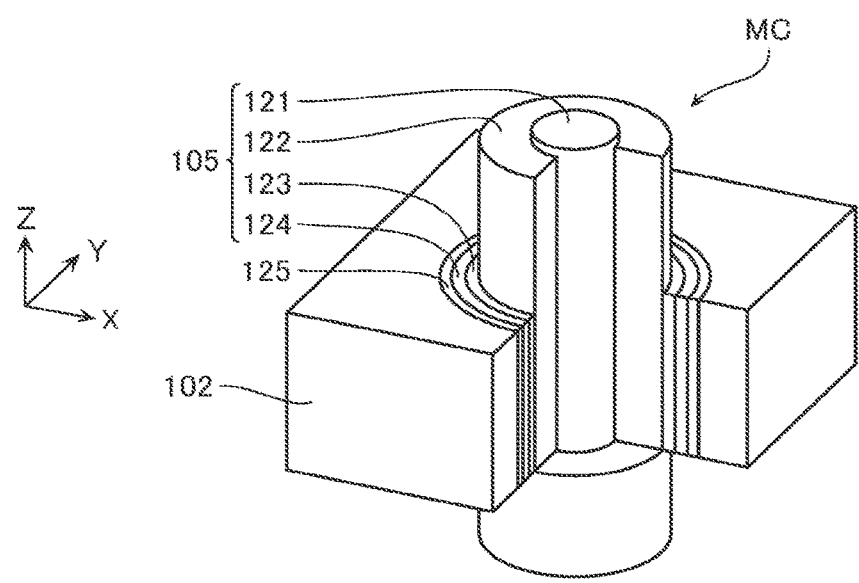
FIG. 4 is a schematic perspective diagram that illustrates a structure of the memory cell MC.

Next, with reference to FIG. 4, the following describes a schematic configuration of the memory cell MC. FIG. 4 is a schematic perspective view illustrating the configuration of the memory cell MC. FIG. 4 omits a part of the configuration.

The memory cell MC is disposed at a portion where the conductive layer 102 intersects with the memory shaft 105. The memory shaft 105 includes, in an order from its center side, a core insulating layer 121, a semiconductor layer 122, a tunnel insulating layer 123, and an charge accumulating layer 124. The semiconductor layer 122, the tunnel insulating layer 123, and the charge accumulating layer 124 are stacked on the sidewall of the core insulating layer 121. Furthermore, a block insulating layer 125 is disposed between the memory shaft 105 and the conductive layer 102.

The core insulating layer 121 is composed of an insulating layer such as silicon oxide ($SiO_2$), for example. The semiconductor layer 122 is composed of a semiconductor layer such as silicon (Si), silicon germanium (Site), silicon carbide (SiC), and carbon (C), for example. The semiconductor layer 122 functions as a channel of the memory cell MC. The tunnel insulating layer 123 is composed of an insulating layer such as silicon oxide ($SiO_2$), for example. The charge accumulating layer 124 is composed of an insulating layer such as silicon nitride (SiN) that can accumulate charges, for example. The block insulating layer 125 is composed of an insulating layer such as silicon oxide ($SiO_2$), for example. Although FIG. 4 omits illustration, a ferroelectric film including alumina ($Al_2O_3$), for example, may be inserted between the block insulating layer 125 and the conductive layer 102. A conductive layer 126 for reducing a contact resistance to a later-described contact 137 is arranged at the uppper end of the core insulating layer 121. The example explained hereinbelow does not have a ferroelectric film. However, it is needless to say that this does not limit the scope of the embodiments.

Figure 5:
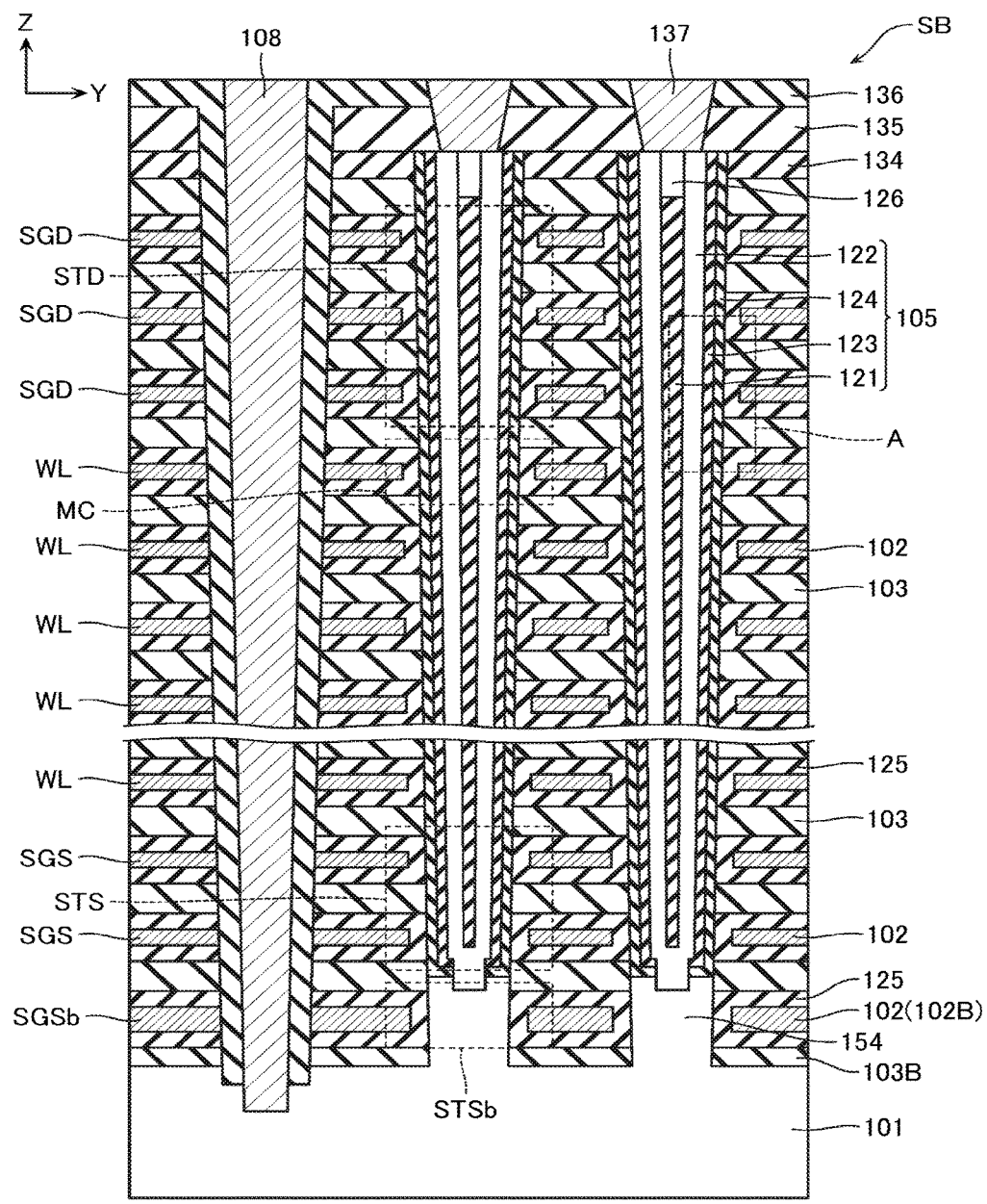
FIG. 5 is a sectional view that illustrates a structure of the nonvolatile semiconductor memory device according to the first embodiment.

Next, with reference to FIG. 5, the nonvolatile semiconductor memory device according to the embodiments will be described more in detail. FIG. 5 is a sectional view that illustrates a part of the structure of the nonvolatile semiconductor memory device.

The nonvolatile semiconductor memory device according to the embodiment includes the substrate 101, a stacked body SB provided on the substrate 101, the memory shaft 105 and the conductive layer 108.

The stacked body SB includes a plurality of the conductive layers 102 laminated on the substrate 101. The plurality of the conductive layers 102 function as the control gates of the memory cells MC, the word lines WL, and the select gate lines of the select transistors STD, STS, STSb, respectively. The memory shaft 105 includes the semiconductor layer 122 extending in the Z-direction that is perpendicular to the substrate 101. This semiconductor layer 122 functions as a channel of the memory cell MC and the like. The conductive layer 108 functions as the source line contact LI.

Next, the stacked body SB will be explained. The stacked body SB includes a plurality of the conductive layers 102 and a plurality of interlayer insulating layers 103 provided alternately on the substrate 101. The stacked body SB also includes the block insulating layers 125 that cover the upper surface, the lower surface and the side surface of the conductive layers 102. The conductive layers 102 are formed of a conductive material such as tungsten (W), for example. The conductive layers 102 function as the control gates of the memory cell MC or the word lines WL. In addition, the interlayer insulating layer 103 and the block insulating layer 125 are formed of an insulating material such as silicon oxide ($SiO_2$).

Note that insulating layer 134, 135, and 136 are further deposited on the upper side of the interlayer insulating layer 103 in this order. In addition, a bit line contact 137 is disposed to penetrate these insulating layers 134, 135 and 136 and reach the memory shaft 105. This bit line contact 137 is connected, at its upper end, to the bit line BL (the conductive layer 106) which is not illustrated.

In addition, an interlayer insulating layer 103B is located between a conductive layer 102B and the substrate 101. This causes the conductive layer 102B to be adjacent to the substrate 101 via the interlayer insulating layer 103B. The film thickness in the Z direction of the interlayer insulating layer 103B is made smaller than the film thickness in the Z direction of the interlayer insulating layer 103 that is located at a higher position than the interlayer insulating layer 103B. Accordingly, when a certain voltage is applied to the lowermost-layer source-side select gate line SGSb (the conductive layer 102B), an inversion layer (a channel) is formed along the surface of the substrate 101. This allows a sufficient cell current to flow through the memory unit MU, the substrate, and the source contact LI.

In addition, the memory shaft 105 includes a semiconductor layer 154. The semiconductor layer 154 is formed integrally with the substrate 101, and extends in the Z direction from the substrate 101. The semiconductor layer 154 is a semiconductor layer which is formed on the substrate 101 by performing epitaxial growth, by which the crystal plane of the semiconductor layer 154 is aligned to that of the substrate 101 as a base layer. When the substrate 101 is a silicon substrate, the semiconductor layer 154 is formed of single-crystal silicon, for example, and functions as a channel of the lowermost-layer source-side select gate transistor SGSb. The upper end of the semiconductor layer 154 is connected to the lower end of the semiconductor layer 122.

As shown in FIG. 5, the tunnel insulating layer 123 and the charge accumulation layer 124 are formed along the side surface of the memory shaft 105. The tunnel insulating layer 123 and the charge accumulation layer 124 are continuously formed without being divided between plurality memory cells MC. Such the structure in which the charge accumulation layer 124 is continuously formed even between plural memory cells MC is advantageous in that it is easy to manufacture. However, it is disadvantageous in that it has a larger inter-element interference between adjacent memory cells MC, as miniaturization of elements progresses.

However, in this embodiment, the inter-element interference is suppressed because a control circuit performs the following voltage application in a write operation.

Figure 6:
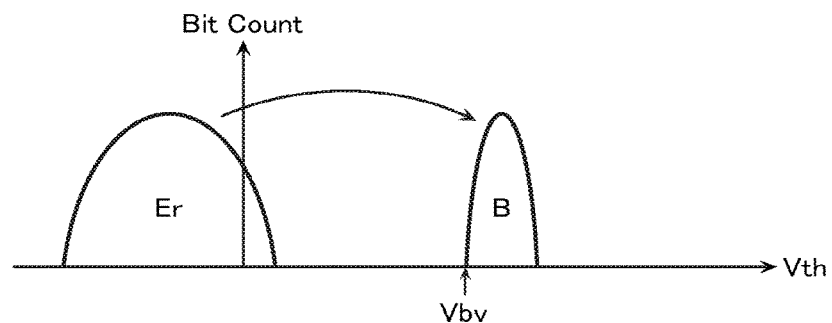
FIG. 6 shows an example of a write operation (in 2 bits/cell scheme) in the nonvolatile semiconductor memory device according to the first embodiment.

First, for comparison, an example of a write operation in a known device will be described with reference to FIG. 6. The following explains a case in which a memory cell MC4 where a word line WL4 is connected is dealt as a selected memory cell. In addition, the following explains a case in which a method of storing 2-bit data in one memory cell MC (2-bit/cell method) is adopted. This is merely an example, and data of 3 bits or more may be written in one memory cell.

2-bit data can be written by two steps: a lower page write operation, and an upper page write operation. As shown in FIG. 6, the lower page write operation is a write operation for writing data of a lower bit of 2-bit data. Specifically, when lower page data "0" is written to a memory cell in the threshold voltage distribution Er (11 data " ") indicating an erased state, a write operation is performed to provide a threshold voltage distribution B that represents lower page data "0". When lower page data is "1", the threshold voltage distribution Er is maintained, and a write prohibiting state is given.

Figure 7:
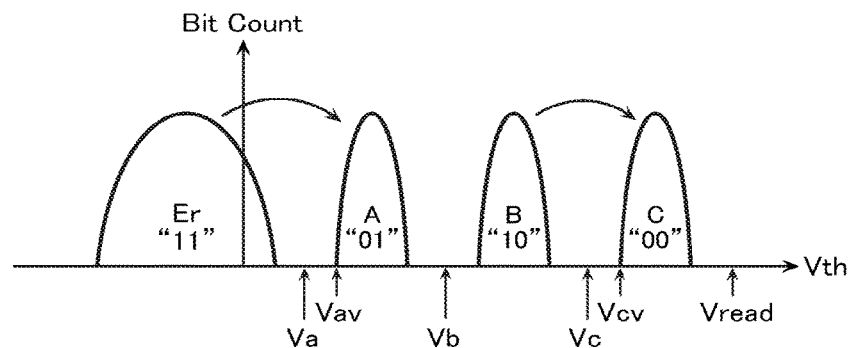
FIG. 7 is an example of a write operation (in 2 bits/cell scheme) in the nonvolatile semiconductor memory device according to the first embodiment.

As shown in FIG. 7, the upper page write operation is a write operation for writing data of upper page data of 2-bit data. Specifically, when upper page data "0" is written to a memory cell having a threshold voltage distribution Er (data "11") or a threshold voltage distribution B, a write operation is performed to provide a threshold voltage distribution A or C. A voltage application operation is conducted such that the memory cell MC having a threshold voltage distribution Er is given a threshold voltage distribution A, and the memory cell MC having a threshold voltage distribution B is given a threshold voltage distribution C. When upper page data is "1", the threshold voltage distribution Er or B is maintained, and a writing prohibiting state is given.

Figure 8:
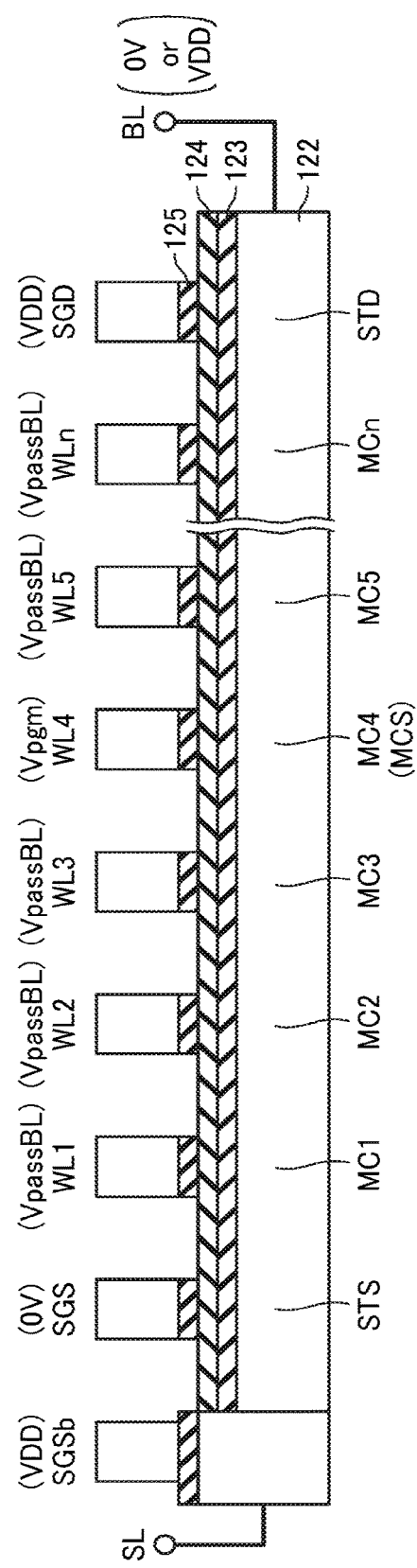
FIG. 8 explains voltages applied in a write operation in a known device.

In a known device, both the lower page write operation and the upper page write operation are performed by applying voltages to respective wiring lines, as shown in FIG. 8. A program voltage Vpgm (20 V or more, for example) for writing is applied to a selected word line WL connected to a selected memory cell MCS (in this example, MC4). On the other hand, write pass voltages VpassBL (around 8 to 10 V, for example) that do not write memory cells but cause memory cells to be conductive are applied to the word lines WL to which non-selected memory cells are connected. The bit lines BL are provided with a power supply voltage VDD or 0 V, depending on data to be written. The select gate line SGD connected to the select transistors STD is provided with the power supply voltage VDD. The select gate line SGS connected to the select transistors STS is provided with 0 V, for example. The voltage of the source line SL is set to 0 V, for example. The lowermost-layer select gate line SGSb is provided with the power supply voltage VDD.

When 0 V is applied to the bit line BL, the drain side select gate transistor STD is set to a conductive state, and 0 V is thereby supplied to the semiconductor layer 122. Due to this, the charge accumulation layer 124 of the selected memory cell MCS is given a state where electrons can be injected thereto based on the potential difference to the program voltage Vpgm (a write-permitted state).

On the other hand, when the power supply voltage VDD is applied to the bit line BL, the drain side select gate transistor STD is set to a non-conductive state, and the semiconductor layer 122 is given a floating state (write-prohibited state).

After a lower page write operation or an upper page write operation is performed by the voltages as shown in FIG. 8, a verify read operation is performed as a read operation for confirming whether a desired threshold voltage distribution A, B or C is obtained, although illustration thereof is omitted.

In the verify read operation, any one of verify read voltages Vav, Vbv and Vcv, which correspond to the lower limits of the threshold voltage distributions to be provided, is applied to the selected word line WL connected to the selected memory cell MC (FIG. 6, cf. FIG. 7), similar to a normal read operation. These verify read voltage Vav, Vbv and Vcv correspond to the lower limits of the threshold voltage distributions A, B, and C, and are higher than read voltages Va, Vb and Vc that are given to the control gate of the selected memory cell in a read operation. On the other hand, non-selected word lines connected to non-selected memory cells are given a read path voltage Vread that turns on the memory cell MC regardless of stored data (the voltage Vread has a value higher than the upper limit of the threshold voltage distribution C, for example). The bit line BL is provided with a certain pre-charge voltage Vb.

Figure 9:
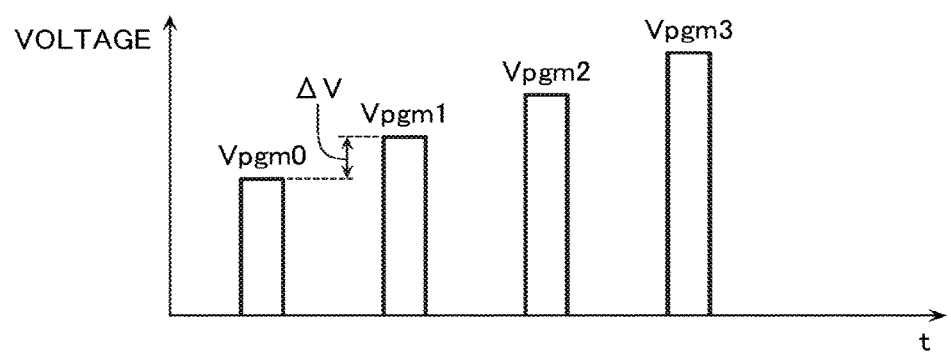
FIG. 9 explains a write operation (a step-up operation) in the nonvolatile semiconductor memory device according to the first embodiment.

Under this condition, if a current flows through the selected memory cell MC, the write operation to the threshold voltage distribution corresponding to the verify read voltage is determined as not completed (FAIL). On the other hand, if a current does not flow through the selected memory cell MC, the write operation is determined as completed (PASS). When determined as FAIL in this verify read operation, the next write operation sets the program voltage Vpgm to a larger value by a step-up width ΔV. This operation is referred to as a step-up operation in the following description. For example, as shown in FIG. 9, a write operation is started with a program voltage Vpgm set to an initial value Vpgm0. Then, it is judged as FAIL in the verify read operation, the step-up operation is conducted. Generally speaking, there is a tendency that as the threshold voltage to be provided to a selected memory cell is higher, the number of times of the step-up operations becomes larger.

As described above, in the write operation of the known device, the voltages applied to the non-selected word lines WL connected to the non-selected memory cells are all set to the same voltage VpassBL, regardless of the position of the word line. However, as will be described in detail later, the inter-element interference may cause changes in threshold voltage of the non-selected memory cells.

Figure 10:
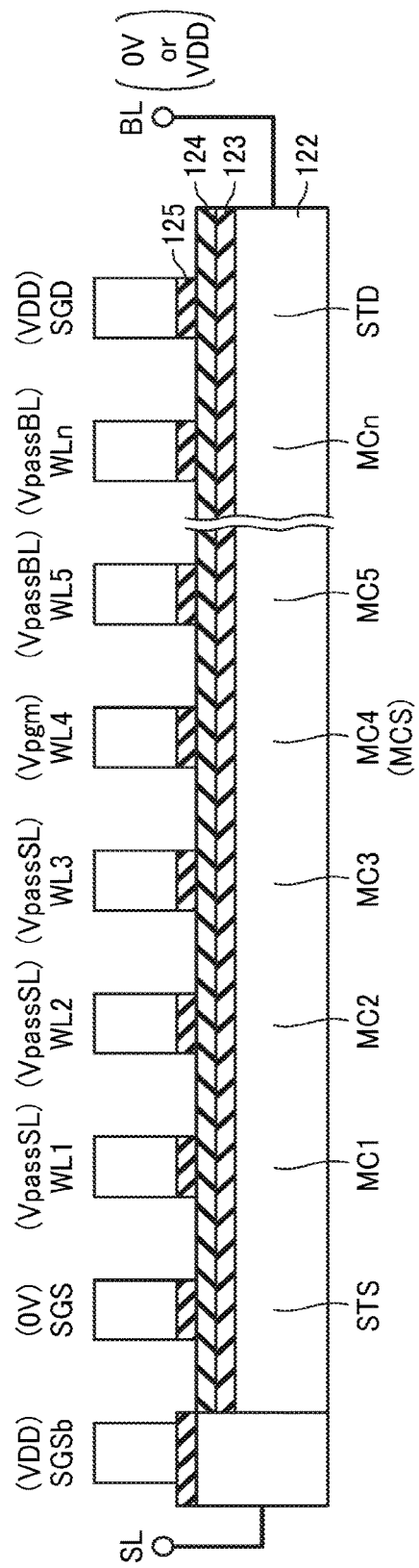
FIG. 10 explains voltages applied in a write operation in the nonvolatile semiconductor memory device of the first embodiment.

Accordingly, the write operation of the first embodiment is performed as follows, as shown in FIG. 10. That is, a write pass voltage VpassBL is applied to non-selected word lines WL on the bit line BL side of the selected memory cell MC4, similarly to the known device. On the other hand, a write pass voltage VpassSL (<VpassBL) which is lower than the above-mentioned write pass voltage VpassBL is applied to non-selected word lines WL on the source line SL side of the selected memory cell MC4. For example, the write pass voltage VpassSL may be set to a voltage smaller than the write pass voltage VpassBL by 2 to 3 V. When inter-element interference is desired to be further suppressed, it is preferable that the write pass voltage VpassSL is set to a negative price (VpassSL<0). Suppressing the inter-element interference may suppress unexpected changes of the threshold voltages in the non-selected memory cells.

However, the application of the voltages of FIG. 10 is performed only when the threshold voltage Vth to be provided to the selected memory cell MCS by a write operation is not less than a certain value (for example, 3V). When the threshold voltage Vth to be provided by a write operation to the selected memory cell MCS is less than a certain value, the same write pass voltage VpassBL is applied to all of the non-selected word lined WL, similar to FIG. 8. For example, suppose the case where the write operation of 2-bit/cell as illustrated in FIGS. 6 and 7 is performed. In this case, when a write operation to the threshold voltage distribution A among the threshold voltage distributions A to C is performed, voltage application of FIG. 8 may be performed. When a write operation to the threshold voltage distribution B or C is performed, voltage application of FIG. 10 may be performed.

In the voltage application method of FIG. 10, although inter-element interference is suppressed, electron mobility decreases, and the speed of the write operation deteriorates. On the other hand, in the voltage application method of FIG. 8, although the inter-element interference is large, electron mobility is high. When the threshold voltage Vth to be provided to the selected memory cell MCS is low (for example, when the threshold voltage distribution A is given), the voltage to be applied to the control gate of the selected memory cell MCS (the selected word line WL4) may have a small value, and the number of pulse application of the program voltage Vpgm often may be small. Accordingly, switching between the operation of FIG. 8 and the operation of FIG. 10 depending on the value of the threshold voltage Vth to be provided to the selected memory cell MCS may lead to both improvement in the writing speed and suppression of inter-element interference.

As discussed above, in a write operation, the first embodiment changes the magnitude of the write pass voltages to be provided to non-selected word lines depending on the magnitude of the threshold voltage to be provided to the selected memory cell MCS. This suppresses the decrease in the write operation speed, and restricts the inter-element interference in the adjacent memory cells.

An advantage of the first embodiment will be described with reference to FIG. 11 to FIG. 13.

Figure 11:
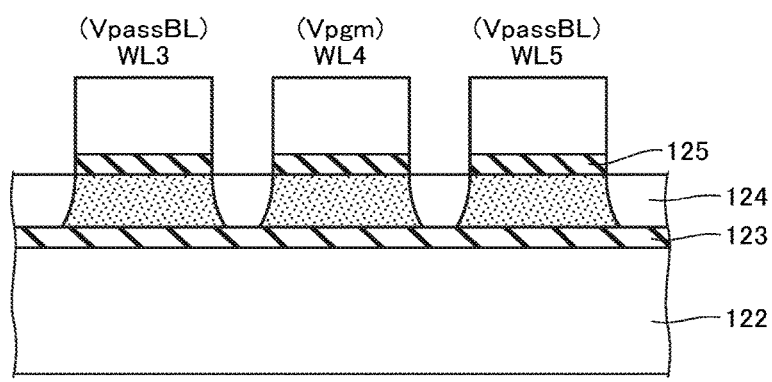
FIG. 11 explains an advantage of the first embodiment.
Figure 12:
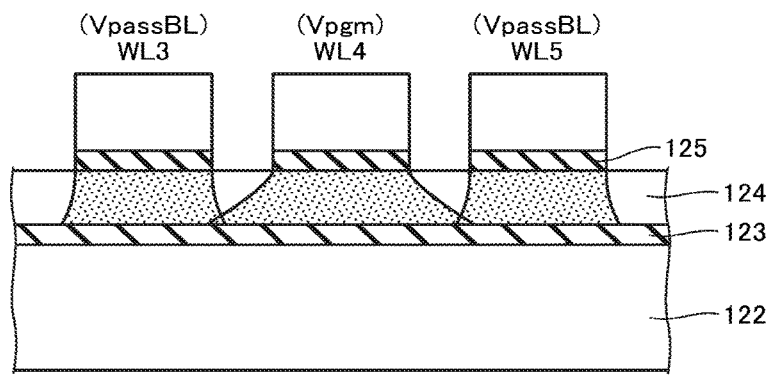
FIG. 12 explains an advantage of the first embodiment.
Figure 13:
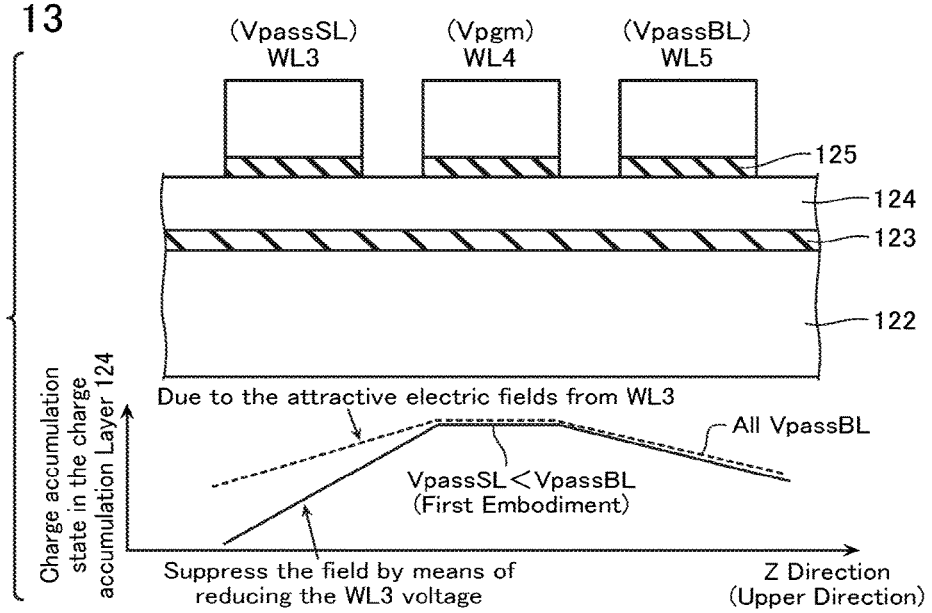
FIG. 13 explains an advantage of the first embodiment.

FIGS. 11 and 12 are conceptual diagrams that illustrate a charge accumulation state in the charge accumulation layer 124 when a write operation is performed in the known device. In addition, FIG. 13 is a conceptual diagram that illustrates a charge accumulation state in the charge accumulation layer 124 in the first embodiment. In FIG. 11 to FIG. 13, parts with hatching illustrate regions where accumulated charges exist in the charge accumulation layer 124.

Herein, it is supposed that the memory cell MC4 is supposed to be the selected memory cell MCS. In this case, if the voltage VpassBL is applied to all of the non-selected word lines WL both on the bit line BL side and the source line SL side, the regions in the charge accumulation layer 124 where charges are accumulated may overlap at a position between the selected memory cell MC4 and the adjacent non-selected memory cell MC3, and in a position between the selected memory cell MC4 and the adjacent non-selected memory cell MC5.

As shown in FIG. 11, when a lower page is written, the amount of accumulated charges in the charge accumulation layer 124 in the selected memory cell MC4 is small. In this case, there is a low possibility that the regions where the accumulated charges exist overlap.

However, as shown in FIG. 12, when an upper page is written, the amount of accumulated charges in the charge accumulation layer 124 in the selected memory cell MC4 is large. In this case, there is a high possibility that the regions where the accumulated charges exist overlap.

If the regions where the accumulated charges exist overlap, and the overlapped regions are large, charges may move through the overlapped regions, and due to this, there is a possibility that an unexpected change in threshold voltage may occur in the non-selected memory cells. For example, in a write operation that selects the memory cell MC4 as a selected memory cell, if the threshold voltage Vth as a target voltage is high, and therefore the amount of charges injected into the charge accumulation layer 124 in the selected memory cell MC4 is large, the region where the accumulated charges exist in the charge accumulation layer 124 in the selected memory cell MC4 will expands toward the adjacent non-selected memory cells MC3 and MC5. This causes the distribution of the accumulated charges which determine the threshold voltages of the adjacent non-selected memory cells MC3 and MC5 to change, thereby changing the threshold voltages of adjacent non-selected memory cells MC3 and MC5. This means that a write operation to the selected memory cell MC4 causes the threshold voltages of the adjacent non-selected memory cells MC3 and MC5 MC5 to vary. Particularly, this tendency is significant when the threshold voltage Vth of the selected memory cell MC4 is raised to a high voltage, e.g., 3 V or more. Such unexpected change in threshold voltage of the non-selected memory cell is referred to as "inter-element interference".

Figure 14:
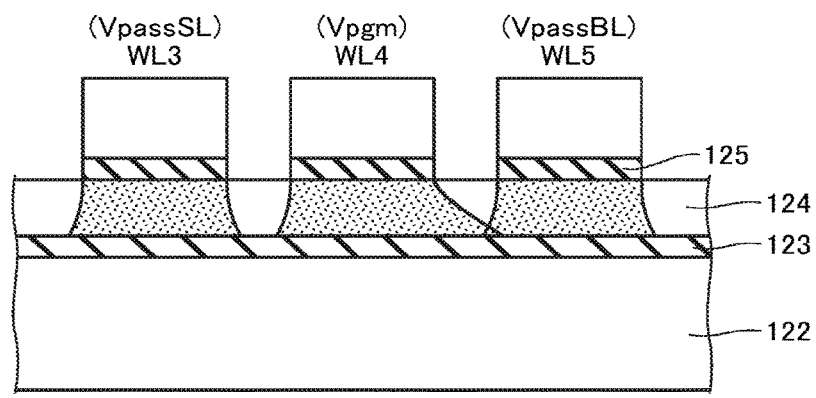
FIG. 14 explains an advantage of the first embodiment.

Accordingly, in the first embodiment, the write pass voltage VpassBL having a high voltage value is applied to the non-selected word lines WL located on the bit line BL side of the selected memory cell MCS, while the write pass voltage VpassSL (<VpassBL) having a low voltage value is applied only to the non-selected word lines WL located on the source line SL side of the selected memory cell MCS. By doing so, as shown in FIG. 13, the accumulated-charge concentration at the end on the source line SL side of the charge accumulation layer 124 of the selected memory cell MCS (MC4) becomes lower than the accumulated-charge concentration at the end on the bit line BL side of the charge accumulation layer 124 of the selected memory cell MCS (MC4). Due to this, as shown in FIG. 14, the region where the accumulated charges exist in the charge accumulation layer 124 shifts to the bit line BL side in the selected memory cell MC4. This may prevent the regions where the accumulated charges exist from overlapping between the selected memory cell MC4 and the adjacent non-selected memory cell MC3 on the source line SL side. This may decrease charge injection from the end on the source line SL side of the selected memory cell MC4.

Even with this alone, a write operation to the selected memory cell MC4 may be less affective to the adjacent non-selected memory cell MC3 that is adjacent thereto at the source line SL side. Specifically, the variation of the amount of the accumulated charges that have been already retained in the non-selected memory cell MC may be decreased. That is, the write operation to the selected memory cell MC4 may be less influential to the variation of the threshold voltage of the adjacent non-selected memory cell MC3 at the source line SL side.

On the other hand, the write pass voltage applied to the adjacent non-selected memory cell MC5 at the bit line BL side is VpassBL, similarly to the known device. Accordingly, there remains a possibility that a write operation to the selected memory cell MC4 may affect the variation of the threshold voltage of the non-selected memory cell MC5 adjacent at the bit line BL side. However, the write operation begins with the memory cell MC1 at the source line SL side, and proceeds sequentially in a direction toward the bit line BL (MC1→MC2→MC3 . . . ). If the write operation according to such an order is performed while performing a verify read operation as described above, the threshold voltage (accumulation charges) of the memory cell MC5 is shifted by the write operation to the selected memory cell MC4, compared to before the write operation. However, this shift of the threshold voltage may be modified when a write operation to the memory cell MC5 is performed. That is, if a write operation is performed selecting a memory cell to be written in turn from the source line SL side to the bit line BL side, the threshold shift of the adjacent non-selected memory cell on the bit line BL side of the selected memory cell MCS can be reduced eventually. If a write operation of the first embodiment is performed when the threshold voltage Vth of the selected memory cell MC4 is raised to a high value, e.g., 3V or more, the time required for the write operation may be shortened, and the inter-element interference may be suppressed effectively.

Figure 15:
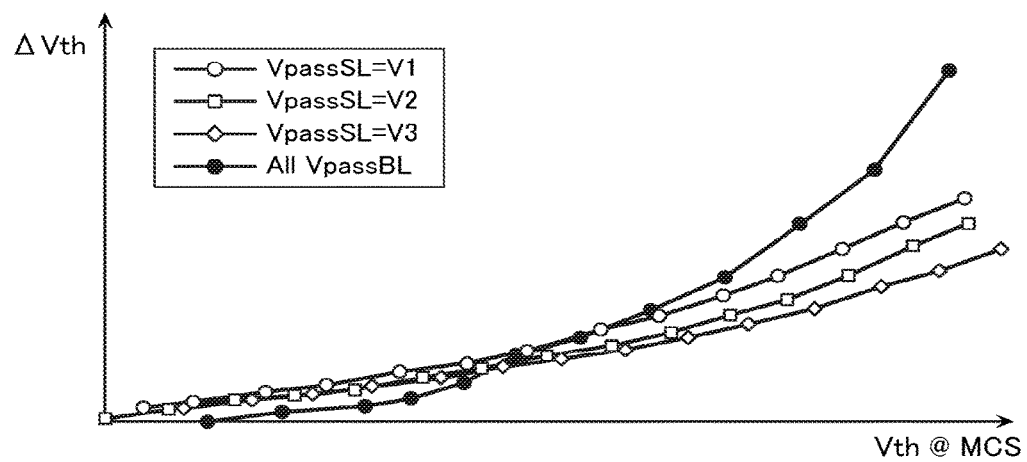
FIG. 15 explains the advantage of the first embodiment.

FIG. 15 are graphs that indicate the relations between the threshold voltage Vth@MCS to be provided to the selected memory cell MCS, and the amount of variation ΔVth of the threshold voltage in the adjacent non-selected memory cells when Vth@MCS is provided, for different values of the write pass voltages to be provided to the non-selected word lines. Among these graphs, the curve of black-circle dots shows the case where the known method that provide a high write pass voltage VpassBL to all of the non-selected word lines is applied. In addition, the graphs of white-circle dots, rectangular dots, and rhombus dots indicate cases where the non-selected word lines positioned at the source line SL side of the selected memory cell MCS are provided with a write pass voltage VpassSL which is lower than in the bit line BL side. The graph of white-circle dots, rectangular dots, and rhombus dots indicate that the voltage value of VpassSL is set to V1, V2, V3 (V1>V2>V3), respectively.

As is apparent from FIG. 15, when the threshold voltage Vth@MCS to be provided to the selected memory cell MCS is small, the amount of variation ΔVth of the threshold voltage is suppressed to a small value, regardless of a value of the write pass voltage to be provided to the non-selected word line WL. However, it is understood that as the threshold voltage Vth@MCS to be provided to the selected memory cell MCS becomes higher, the influence of the write pass voltage to be provided to the non-selected word lines WL becomes remarkable. When a high write pass voltage VpassBL is provided to all of the non-selected word lines, the amount of variation ΔVth of the threshold voltage in the adjacent non-selected memory cells becomes higher. In contrast, when the write pass voltage VpassSL is applied to the non-selected word lines WL located in the source line SL side of the selected memory cell MCS, the amount of variation ΔVth becomes lower. As the voltage value of the voltage VpassSL becomes smaller like V1, V2, V3 . . . , the amount of variation ΔVth further becomes smaller.

Second Embodiment

Next, a semiconductor memory device according to the second embodiment will be described with reference to FIG. 16. Since the structure of the semiconductor memory device of the second embodiment is substantially the same as that of the first embodiment, the duplicated explanation will be omitted. In this the second embodiment, voltage application in the write operation is different from the first embodiment.

Figure 16:
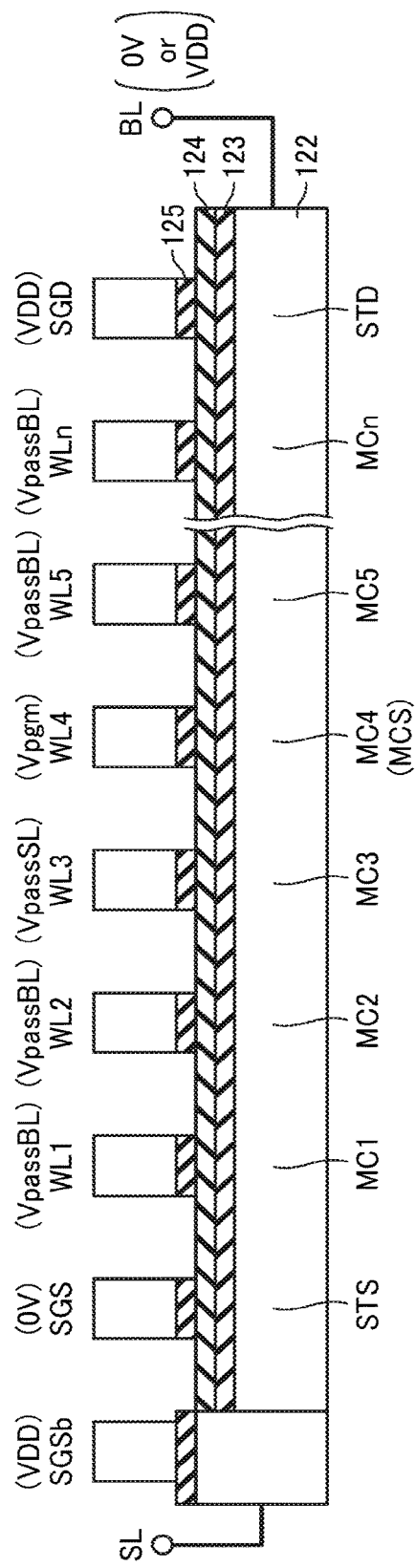
FIG. 16 explains voltages applied in a write operation in the nonvolatile semiconductor memory device of the second embodiment.

As shown in FIG. 16, when a write operation is performed to the selected memory cell MCS, for example to the memory cell MC4, this second embodiment provides a low write pass voltage VpassSL only to the word line WL3 that is adjacent to the selected memory cell MC4 at the source line SL side. The non-selected word lines WL that are positioned on the source line SL side of the word line WL3 are provided with a high write pass voltage VpassBL. This is different from the first embodiment. Note that voltage application of FIG. 16 is performed when the threshold voltage Vth to be provided to the selected memory cell MCS is not less than a certain value (for example, 3 V), while the operation of FIG. 8 is performed when it is less than the certain value. This feature is the same as the first embodiment. As described above, even under a method of providing the write pass voltage VpassSL only to the non-selected word line WL3 which is adjacent to the selected memory cell MC4 on the source line SL side, the inter-element interference between the selected memory cell MC4 and the adjacent non-selected memory cell MC3 is sufficiently suppressed. Thus, according to this second embodiment, the advantage substantially the same as that of the first embodiment can be obtained.

Third Embodiment

Next, a semiconductor memory device according to the third embodiment will be described with reference to FIG. 17. Since the structure of the semiconductor memory device of the second embodiment is substantially the same as that of the first embodiment, the duplicated explanation will be omitted. In this third embodiment, voltage application in the write operation is different from the first embodiment.

This third embodiment is similar to the first embodiment in that, when a write operation is performed on the selected memory cell MCS, for example, on the memory cell MC4, the word lines WL1 to WL3 located on the source line side of the selected memory cell MC4 are provided with a write pass voltage that is lower than the write pass voltage VpassBL.

However, in this third embodiment, when there are a plurality of non-selected word lines WL between the source line SL and the selected memory cell MCS, a non-selected word line WL which is farther from the selected memory cell MCS is provided with a lower voltage. That is, in the case of FIG. 17, the voltages to be provided to the non-selected word lines WL3, WL2, and WL1 are VpassSL3, VpassSL2, VpassSL1, respectively. They are given a relationship of VpassSL3>VpassSL2>VpassSL1. This is different from the first embodiment.

Figure 17:
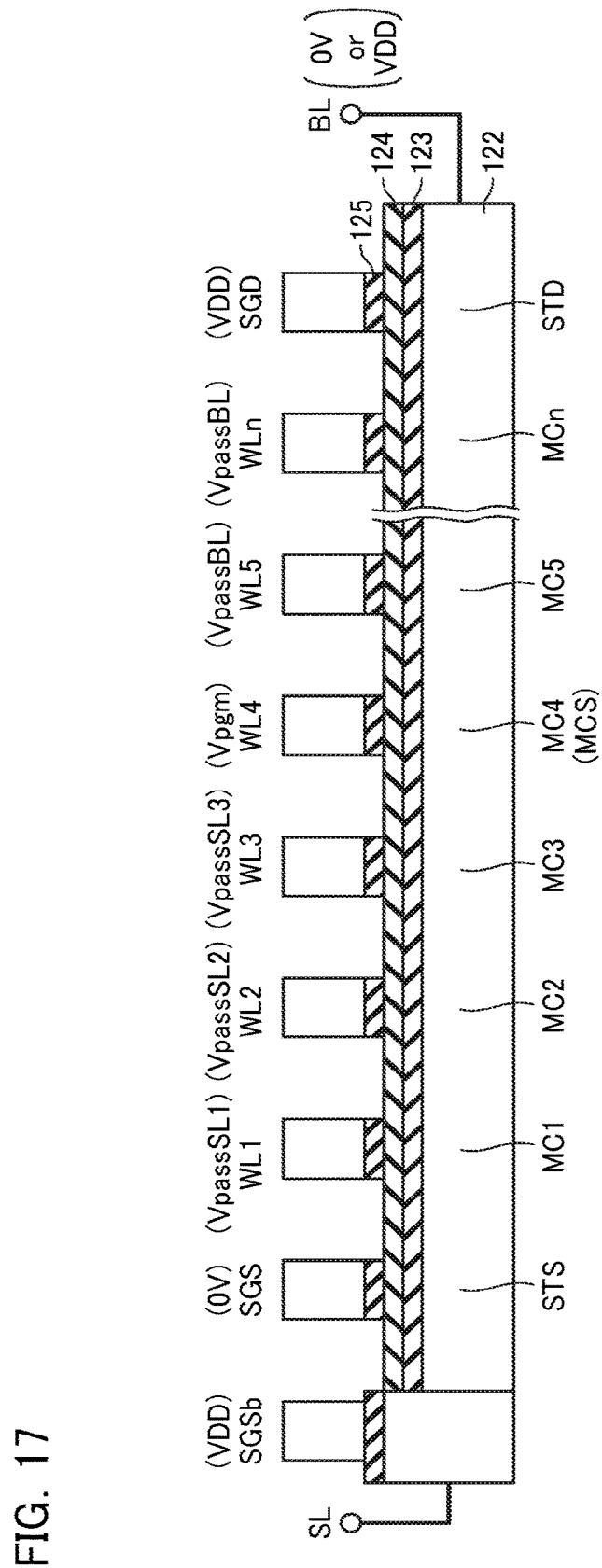
FIG. 17 explains voltages applied in a write operation in the nonvolatile semiconductor memory device of the third embodiment.

Note that voltage application of FIG. 17 is performed when the threshold voltage Vth to be provided to the selected memory cell MCS is not less than a certain value (for example, 3 V), while the operation of FIG. 8 is performed when it is less than the certain value. This feature is the same as the first embodiment. According to the third embodiment, the advantage that is generally the same as the first embodiment may be obtained.

Fourth Embodiment

Next, a semiconductor memory device according to the fourth embodiment will be described with reference to FIG. 18. Since the structure of the semiconductor memory device of the second embodiment is substantially the same as that of the first embodiment, the duplicated explanation will be omitted. In this fourth embodiment, voltage application in the write operation is different from the first embodiment.

Figure 18:
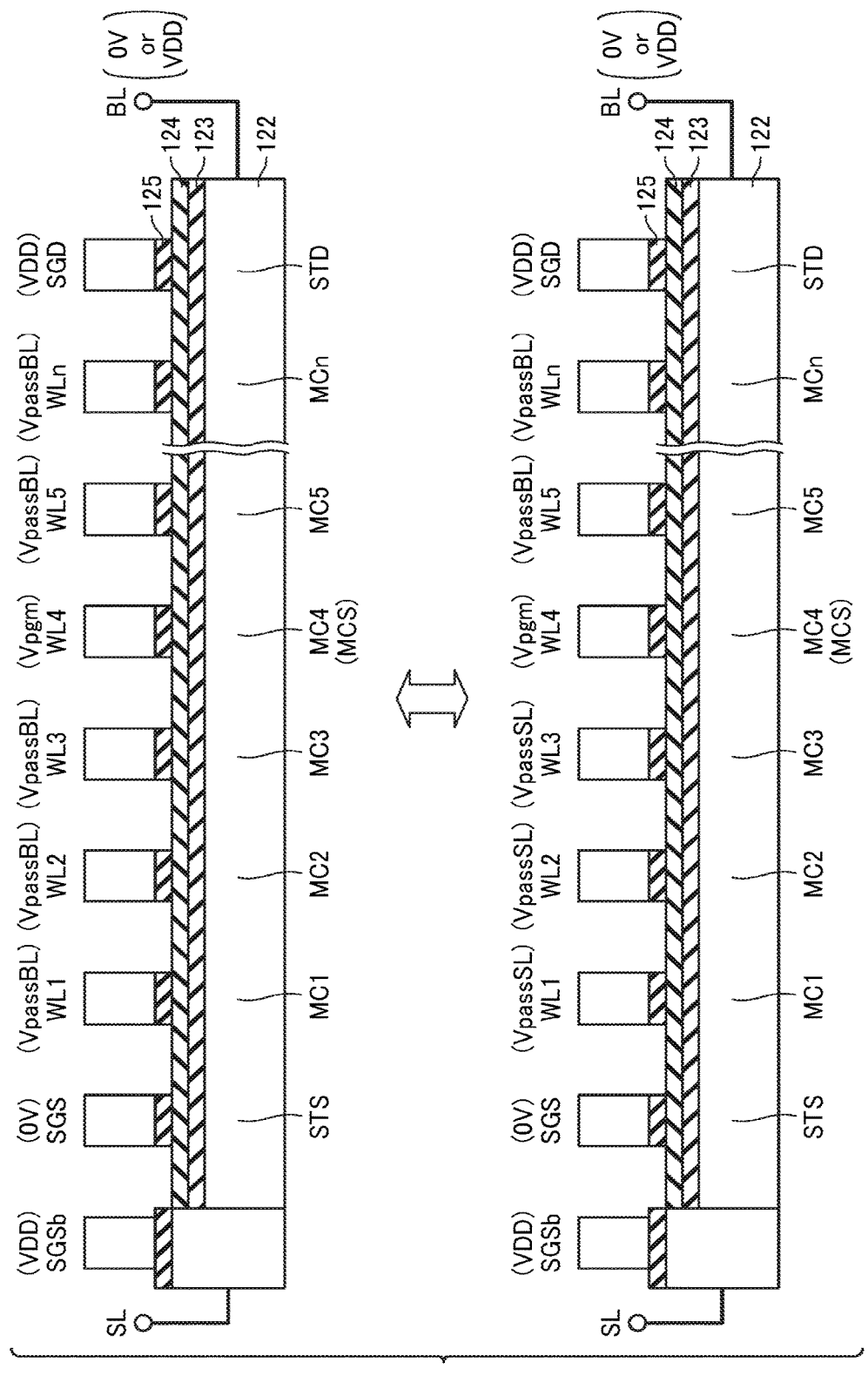
FIG. 18 explains voltages applied in a write operation in the nonvolatile semiconductor memory device of the fourth embodiment.

This fourth embodiment is different from the above-mentioned embodiments in that the first voltage application operation and the second voltage application operation are repeated as shown in FIG. 18. The first voltage application operation is a voltage application operation that applies the same write pass voltage VpassBL to all of the non-selected word lines WL, and is the same voltage application operation as a method conducted in the known device. On the other hand, the second voltage application operation is a voltage application operation in which a write pass voltage VpassBL is applied to non-selected word lines WL on the bit line BL side of the selected memory cell MCS, while a write pass voltage VpassSL which is lower than the write pass voltage VpassBL is applied to non-selected word lines WL on the source line SL side of the selected memory cell MCS. These two voltage application operation are performed in turn, for example, one by one. Since the first voltage application operation is the same as the known method, the inter-element interference is large. However, in the second voltage application operation, the inter-element interference is suppressed. The inter-element interference may be suppressed by performing the first voltage application operation and the second voltage application operation in turn, for example, in one write operation.

Note that the operation of this fourth embodiment is conducted, as is similar to the above-mentioned embodiments, only when the threshold voltage Vth to be provided to the selected memory cell MCS is not less than a certain value. If it is less than the certain value, the known method (FIG. 8) may be used, like in the above-mentioned embodiments.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A semiconductor memory device, comprising:
a memory cell array in which a plurality of memory cells are connected in series to form a memory unit;
word lines connected to control gates of the plurality of memory cells;
a bit line connected to a first end of the memory unit;
a source line connected to a second end of the memory unit; and
a control unit that controls the memory cell array, wherein in a write operation to the memory cells, the control unit is operative to, when a threshold voltage to be provided to a selected memory cell is not less than a reference value,
apply a program voltage to a word line corresponding to a selected memory cell, and
cause a voltage applied to a first word line corresponding to a first non-selected memory cell positioned between the first end and the selected memory cell to be higher than a voltage applied to a second word line corresponding to a second non-selected memory cell positioned between the second end and the selected memory cell.

2. The semiconductor memory device according to claim 1, wherein
the voltage applied to the second word line when a threshold voltage to be provided to a selected memory cell is not less than a reference value has a negative value.

3. The semiconductor memory device according to claim 1, wherein
in a write operation to the memory cells, the control unit is operative to, when a threshold voltage to be provided to a selected memory cell is less than a reference value, apply a program voltage to a word line corresponding to a selected memory cell, and cause a voltage applied to a first word line corresponding to a first non-selected memory cell positioned between the first end and the selected memory cell to be equal to a voltage applied to a second word line corresponding to a second non-selected memory cell positioned between the second end and the selected memory cell.

4. The semiconductor memory device according to claim 3, wherein the voltage applied to the second word line when a threshold voltage to be provided to a selected memory cell is not less than a reference value has a negative value.

5. The semiconductor memory device according to claim 1, wherein when there are a plurality of the second word lines, the control unit applies a higher voltage to a second word line which is closer to the selected memory cell.

6. The semiconductor memory device according to claim 1, wherein when a threshold voltage to be provided to a selected memory cell is not less than a reference value, the control unit is operative to perform a first voltage application operation and a second voltage application operation, the first voltage application operation causing a voltage applied to the first word line to be higher than a voltage applied to the second word line, and the second voltage application operation causing a voltage applied to the first word line to be equal to a voltage applied to the second word line.

7. The semiconductor memory device according to claim 3, wherein when a threshold voltage to be provided to a selected memory cell is not less than a reference value, the control unit is operative to perform a first voltage application operation and a second voltage application operation, the first voltage application operation causing a voltage applied to the first word line to be higher than a voltage applied to the second word line, and the second voltage application operation causing a voltage applied to the first word line to be equal to a voltage applied to the second word line.

8. The semiconductor memory device according to claim 7, wherein the voltage applied to the second word line when a threshold voltage to be provided to a selected memory cell is not less than a reference value has a negative value.

9. The semiconductor memory device according to claim 1, wherein the control unit is operative to sequentially select memory cells from the second end to perform a write operation.

10. The semiconductor memory device according to claim 9, wherein the voltage applied to the second word line when a threshold voltage to be provided to a selected memory cell is not less than a reference value has a negative value.

11. The semiconductor memory device according to claim 1, wherein the memory unit includes:

a memory shaft;

a charge accumulation layer provided on a sidewall of the memory shaft; and s conductive layer that surrounds a side surface of the memory shaft, the charge accumulation layer is continuously provided over a plurality of the memory cells in one memory unit.

12. A method of controlling a semiconductor memory device, the semiconductor memory device comprising: a memory cell array in which a plurality of memory cells are connected in series to form a memory unit; word lines connected to control gates of the plurality of memory cells; a bit line connected to a first end of the memory unit; and a source line connected to a second end of the memory unit, wherein in a write operation to the memory cells, the method includes, when a threshold voltage to be provided to a selected memory cell is not less than a reference value, applying a program voltage to a word line corresponding to a selected memory cell, and causing a voltage applied to a first word line corresponding to a first non-selected memory cell positioned between the first end and the selected memory cell to be equal to a voltage applied to a second word line corresponding to a second non-selected memory cell positioned between the second end and the selected memory cell.

13. The method of controlling a semiconductor memory device according to claim 12, wherein the voltage applied to the second word line when a threshold voltage to be provided to a selected memory cell is not less than a reference value has a negative value.

14. The method of controlling a semiconductor memory device according to claim 12, wherein when a threshold voltage to be provided to a selected memory cell is not less than a reference value, the method performs a first voltage application operation and a second voltage application operation, the first voltage application operation causing a voltage applied to the first word line to be higher than a voltage applied to the second word line, and the second voltage application operation causing a voltage applied to the first word line to be equal to a voltage applied to the second word line.

15. The method of controlling a semiconductor memory device according to claim 12, wherein in a write operation to the memory cells, when a threshold voltage to be provided to a selected memory cell is less than a reference value, the method further including:

applying a program voltage to a word line corresponding to a selected memory cell, and causing a voltage applied to a first word line corresponding to a first non-selected memory cell positioned between the first end and the selected memory cell to be equal to a voltage applied to a second word line corresponding to a second non-selected memory cell positioned between the second end and the selected memory cell.

16. The method of controlling a semiconductor memory device according to claim 15, wherein when a threshold voltage to be provided to a selected memory cell is not less than a reference value, the method performs a first voltage application operation and a second voltage application operation, the first voltage application operation causing a voltage applied to the first word line to be higher than a voltage applied to the second word line, and the second voltage application operation causing a voltage applied to the first word line to be equal to a voltage applied to the second word line.

* * * * *